US012119135B2

(12) United States Patent
Sugawara et al.

(10) Patent No.: US 12,119,135 B2
(45) Date of Patent: Oct. 15, 2024

(54) ELECTRICALLY CONDUCTIVE POLYMER COMPOSITION AND METHOD FOR STABLY STORING ELECTRICALLY CONDUCTIVE POLYMER SOLUTION

(71) Applicant: SHOWA DENKO K.K., Tokyo (JP)

(72) Inventors: Atsushi Sugawara, Tokyo (JP); Jun Konishi, Tokyo (JP)

(73) Assignee: Resonac Corporation, Tokyo (JP)

( * ) Notice: Subject to any disclaimer, the term of this patent is extended or adjusted under 35 U.S.C. 154(b) by 0 days.

(21) Appl. No.: 17/611,317

(22) PCT Filed: May 14, 2020

(86) PCT No.: PCT/JP2020/019182
§ 371 (c)(1),
(2) Date: Nov. 15, 2021

(87) PCT Pub. No.: WO2020/230835
PCT Pub. Date: Nov. 19, 2020

(65) Prior Publication Data
US 2022/0215981 A1 Jul. 7, 2022

(30) Foreign Application Priority Data
May 16, 2019 (JP) .................... 2019-092903

(51) Int. Cl.
*H01B 1/00* (2006.01)
*C08L 33/26* (2006.01)
*H01B 1/12* (2006.01)

(52) U.S. Cl.
CPC .............. *H01B 1/125* (2013.01); *C08L 33/26* (2013.01); *C08L 2203/20* (2013.01)

(58) Field of Classification Search
CPC .......... H01B 1/00; H01B 1/124; H01B 1/125; H01B 1/127; C09D 5/24
See application file for complete search history.

(56) References Cited

U.S. PATENT DOCUMENTS 5,286,414 A * 2/1994 Kampf .................. C09D 5/24
252/500
8,696,767 B2 * 4/2014 Shibuya ................ H01G 11/48
29/25.03

(Continued)

FOREIGN PATENT DOCUMENTS

EP 2 868 698 A1 5/2015
EP 3 255 104 A1 12/2017

(Continued)

OTHER PUBLICATIONS

English language machine translation of JP 2015-118978 (pub date Jun. 2015).*

(Continued)

*Primary Examiner* — Mark Kopec
(74) *Attorney, Agent, or Firm* — Sughrue Mion, PLLC (57) ABSTRACT

The present invention relates to an electrically conductive polymer composition having high dispersion stability in long-term storage without being influenced by air temperature changes in the winter season, the summer period, etc. and a method for stably storing an electrically conductive polymer solution. An electrically conductive polymer composition comprising at least a N-vinyl carboxylic acid amide polymer having a weight-average molecular weight within the range of not less than 5000 and not more than one million, an electrically conductive polymer, and a solvent. A method for stably storing an electrically conductive polymer solution, the method comprising adding, to an electrically conductive polymer solution, a N-vinyl carboxylic acid amide polymer having a weight-average molecular weight within the range of not less than 5000 and not more than one million.

15 Claims, 1 Drawing Sheet

(56) References Cited

U.S. PATENT DOCUMENTS

| | | | |
|---|---|---|---|
| 9,502,295 B2 | 11/2016 | Shinjo et al. | |
| 9,558,862 B2 | 1/2017 | Sawai et al. | |
| 9,589,733 B2* | 3/2017 | Vilc | H01G 9/025 |
| 2005/0029496 A1* | 2/2005 | Schwark | G03G 5/14778 |
| | | | 252/500 |
| 2007/0231604 A1* | 10/2007 | Ohkubo | C09D 5/24 |
| | | | 252/500 |
| 2009/0021894 A1* | 1/2009 | Ning | C09D 5/24 |
| | | | 29/25.03 |
| 2015/0140492 A1* | 5/2015 | Sawai | C08K 5/20 |
| | | | 430/296 |
| 2015/0179538 A1 | 6/2015 | Shinjo et al. | |

FOREIGN PATENT DOCUMENTS

| | | |
|---|---|---|
| JP | 10-60047 A | 3/1998 |
| JP | 10-239715 A | 9/1998 |
| JP | 10-287061 A | 10/1998 |
| JP | 11-322849 A | 11/1999 |
| JP | 2006-77229 A | 3/2006 |
| JP | 2008-222850 A | 9/2008 |
| JP | WO 2011/065546 A1 | 6/2011 |
| JP | 2012-153867 A | 8/2012 |
| JP | 2015-117366 A | 6/2015 |
| JP | 2015-118978 A | 6/2015 |
| JP | 2015-134373 A | 7/2015 |
| JP | 2019-131778 A | 8/2019 |
| WO | 2014/006821 A1 | 1/2014 |

OTHER PUBLICATIONS

Onishi et al., "Effects of additives on the electrical conductivity of PEDOT/PSS films", JAE Technical Report, Mar. 2013, No. 35, pp. 1-9 (9 pages total).

International Search Report dated Jul. 28, 2020 from the International Searching Authority in International Application No. PCT/JP2020/019182.

Written Opinion dated Jul. 28, 2020 from the International Searching Authority in International Application No. PCT/JP2020/019182.

* cited by examiner

ELECTRICALLY CONDUCTIVE POLYMER COMPOSITION AND METHOD FOR STABLY STORING ELECTRICALLY CONDUCTIVE POLYMER SOLUTION

CROSS REFERENCE TO RELATED APPLICATIONS

This application is a National Stage of International Application No. PCT/JP2020/019182 filed May 14, 2020, claiming priority based on Japanese Patent Application No. 2019-092903 filed May 16, 2019.

TECHNICAL FIELD

The present invention relates to an electrically conductive polymer composition having high preservation stability, and relates more specifically to an electrically conductive polymer composition having high dispersion stability in long-term storage without being influenced by air temperature changes in the winter season, the summer period, etc. and a method for stably storing an electrically conductive polymer solution.

BACKGROUND ART

Electrically conductive polymers are widely used for electrolytes of solid electrolytic capacitors, antistatic materials of optical films and the like, hole injection layers of organic EL and solar cells, transparent electrodes, actuators, sensors, thermoelectric transducers, etc.

In Patent Literature 1 below, the present applicant has proposed, as such an electrically conductive polymer, an electrically conductive polymer complex that includes, between a pair of electrodes at least one of which is transparent, a self-doping type electrically conductive polymer having a Brønsted acid group in the molecule and a N-vinyl carboxylic acid amide-based polymer, and has proposed an electrochromic element in which the electrically conductive polymer complex is interposed as an electrolyte.

Further, in Patent Literature 2 below, the present applicant has proposed an electrically conductive composition containing a water-based solvent-soluble electrically conductive polymer that has a n electron conjugated system and that exhibits electrical conductivity by means of an electron conductivity mechanism, and a water-based solvent-soluble resin. In Patent Literature 2, a composition that contains poly(5-sulfoisothianaphthene-1,3-diyl) as a water-based solvent-soluble electrically conductive polymer and contains polyvinylacetamide as a water-based solvent-soluble resin is evaluated as an Example.

Among the electrically conductive polymers, poly(3,4 ethylenedioxythiophene) doped with poly(4-styrenesulfonic acid) (hereinafter, also referred to as PEDOT-PSS) has good electrical conductivity and, when it is used as a thin film, has high light transmissivity, and is therefore one of the most commonly used electrically conductive polymers.

Patent Literature 3 below discloses, as an electrically conductive polymer, an electrically conductive composition composed of PEDOT-PSS and poly-N-vinylacetamide (PNVA).

This Patent Literature 3 discloses PEDOT-PSS that is prepared by adding a sulfuric acid-based oxidizing agent, 3,4-ethylenedioxythiophene (EDOT) as a polymerizable monomer, and polystyrenesulfonic acid as a dopant to a PNVA aqueous solution, and polymerizing of EDOT.

The PNVA is added in order to improve adhesiveness between PEDOT/PSS particles and bondability to a substrate.

CITATION LIST

Patent Literature

Patent Literature 1: JP H10-239715 A
Patent Literature 2: JP 2006-077229 A
Patent Literature 3: JP 2012-153867 A

Non Patent Literature

Non Patent Literature 1: Onishi, Kunikata, and Nakajima, "Effects of additives on the electrical conductivity of PEDOT/PSS films", JAE Technical Report, March 2013, No. 35, pp. 1-9

SUMMARY OF INVENTION

Technical Problem

Although the electrically conductive polymer exists dispersed in a solvent, the holding of the dispersion state is not permanent. For example, in PEDOT-PSS, PEDOT, which is a hydrophobic polymer, is dispersed by PSS, which is hydrophilic (Non Patent Literature 1). However, for many PEDOT-PSS products, the storage condition of 2 to 8° C. is specified by the manufacturer or the distributor. Further, even under such a condition, the shelf life is often set to 12 months after manufacture; thus, the fact that the product is a substance that is likely to experience property changes depending on the storage conditions or period has been an issue.

Specifically, it is known that the original dispersion state is difficult to keep for a long period of time because the intermolecular force works between PSS molecules and t PSS molecules begin to gradually take on a tertiary structure.

In particular, when the product is cooled into a frozen state in storage in a cold district it is known that by remelting or warming or the like, the product becomes activated by movement of molecules, then the initial dispersion state collapses greatly.

Further, it is highly likely that, in the process in which the dispersion collapses as mentioned above or PSS forms a tertiary structure, PSS, which is an insulating layer, will form the outermost layer by confining etc. PEDOT in the inside, and thus there has been concern from the viewpoint of maintaining electrical conductivity.

Further, in Patent Literature 3, when polymerizing EDOT, an oxidizing agent containing a sulfur component such as a sulfate or a persulfate is used in the presence of PNVA, and hence a large amount of sulfur is contained in the composition; further, a PNVA polymer with a high viscosity or molecular weight was used as the PNVA used at the time of polymerization.

In Patent Literature 3, GE191-000, which is a product of the present applicant, is used as the PNVA; for the GE1 000, the viscosity of a 1 mass % aqueous solution is as high as 500 mPa·s and the weight-average molecular weight is four million, and sulfur which is derived from a chain transfer agent but not preferred in semiconductors, is contained in the PNVA.

Hence, in the electrically conductive composition described in Patent Literature 3 using such PNVA, there have been points at issue of being difficult to use in semiconductors and having difficulty in use as a dispersant because of high viscosity.

Solution to Problem

Under such circumstances, the present inventors conducted extensive studies, and have found out that the molecular weight of a N-vinyl carboxylic acid amide polymer greatly influences the stability of long-term storage of an electrically conductive polymer composition. The present inventors have further found out that preservation stability is significantly improved by adding a specific N-vinyl carboxylic acid amide polymer into the electrically conductive polymer composition, and have completed the present invention.

That is, the constitution of the present invention i as follows.

[1] An electrically conductive polymer composition comprising at least a N-vinyl carboxylic acid amide polymer having a weight-average molecular weight within the range of not less than 5000 and not more than one million, an electrically conductive polymer, and a solvent.

[2] The electrically conductive polymer composition according to [1], in which, assuming that the solid content of the electrically conductive polymer is 100 parts by mass, the solid content of the N-vinyl carboxylic acid amide polymer is not less than 10 parts by mass and not more than 200 parts by mass.

[3] The electrically conductive polymer composition according to [1] or [2], in which the solid content concentration of the N-vinyl carboxylic acid amide polymer in the electrically conductive polymer composition is not less than 0.3 mass % and not more than 10 mass %.

[4] The electrically conductive polymer composition according to any one of [1] to [3], in which the N-vinyl carboxylic acid amide polymer is a N-vinylacetamide polymer.

[5] The electrically conductive polymer composition according to any one of [1] to [4], in which the electrically conductive polymer is poly(3,4-ethylenedioxythiophene) doped with poly(4-styrenesulfonic acid) (hereinafter, referred t as PEDOT-PSS).

[6] The electrically conductive polymer composition according to any one of [1] to [5], in which the solvent is water.

[7] The electrically conductive polymer composition according to any one of [1] to [6], in which the viscosity at 20° C. of the electrically conductive polymer composition is not less than 10 mPa·s and not more than 400 mPa·s.

[8] The electrically conductive polymer composition according to any one of [1] to [7], in which the sulfur concentration in the solid content of the N-vinyl carboxylic acid amide polymer is not more than 3000 mass ppm.

[9] The electrically conductive polymer composition according to any one of [1] to [8], in which the N-vinyl carboxylic acid amide polymer is a polymer manufactured by polymerizing a N-vinyl carboxylic acid amide in the presence of a chain transfer agent not containing a sulfur atom, or polymerizing a N-vinyl carboxylic acid amide without the use of a chain transfer agent.

[10] A method for stably storing an electrically conductive polymer solution, the method comprising adding, to an electrically conductive polymer solution, a N-vinyl carboxylic acid amide polymer having a weight-average molecular weight within the range of not less than 5000 and not more than one million.

[11] The method for stably storing an electrically conductive polymer solution according to [10], in which the electrically conductive polymer solution contains at least PEDOT-PSS and water.

[12] The method for stably storing an electrically conductive polymer solution according to [10] or [11], in which the N-vinyl carboxylic acid amide polymer is a N-vinylacetamide polymer.

[13] The method for stably storing an electrically conductive polymer solution according to any one of [10] to [12], in which the N-vinyl carboxylic acid amide polymer is a polymer manufactured by polymerizing a N-vinyl carboxylic acid amide in the presence of a chain transfer agent not containing a sulfur atom, or polymerizing a N-vinyl carboxylic acid amide without the use of a chain transfer agent.

[14] The method for stably storing an electrically conductive polymer solution according to any one of [10] to [13], in which the sulfur concentration in the solid content of the N-vinyl carboxylic acid amide polymer is not more than 3000 mass ppm.

Advantageous Effects of Invention

According to the present invention, preservation stability is considerably improved by adding a specific N-vinyl carboxylic acid amide polymer to an electrically conductive polymer solution.

The present inventors consider that adding the N-vinyl carboxylic acid amide polymer used in the present invention to, for example, PEDOT-PSS, makes it possible to weaken the intermolecular force between PEDOT and PSS or the intermolecular force between complexes of PSS and PEDOT, and makes it possible to prevent the formation of a tertiary structure of PSS alone. It is known that PEDOT-PSS takes on a higher order structure and this contributes to aggregability.

Also the dispersibility in water of PEDOT can be ensured or improved by the amphiphilicity of the N-vinyl carboxylic acid amide polymer, and accordingly electrical conductivity properties can be maintained for a long period of time. Further, although the PEDOT-PSS solution is made strongly acidic for stability, PNVA, which is excellent in acid resistance, is not denatured even in such a strongly acidic solution; furthermore, PNVA is excellent also in heat resistance, and therefore the effect can be persistently exhibited even at the time of heating during the shaping of an electrically conductive polymer film.

A sulfur atom is highly likely to affect the movement of an electron; hence, in the present invention, high electrical conductivity properties can be maintained more stably when using a N-vinyl carboxylic acid amide polymer in which the sulfur content is reduced to a prescribed range.

Actually a N-vinyl carboxylic acid amide polymer polymerized by using a chain transfer agent containing a SH group, or a N-vinyl carboxylic acid amide polymer containing a large amount of sulfur atoms may discolor other materials in an accelerated test.

Further, the N-vinyl carboxylic acid amide polymer of the present invention possesses sufficient wettability, and can also improve the affinity for a glass substrate, a metal, etc. during the formation of an electrically conductive polymer film.

Furthermore, the N-vinyl carboxylic acid amide polymer itself has excellent transparency, and therefore can also be suitably used in applications requiring transparency; this polymer can further be expected to exhibit an antistatic effect.

DESCRIPTION OF EMBODIMENTS

Hereinbelow, the present invention is described specifically. The composition of the present invention is not limited to the following descriptions, as a matter of course.

An electrically conductive polymer composition of the present invention contains at least a N-vinyl carboxylic acid amide polymer, an electrically conductive polymer, and a solvent.

N-Vinyl Carboxylic Acid Amide Polymer:

The N-vinyl carboxylic acid amide polymer of the present invention is a polymer obtained by polymerizing a N-vinyl carboxylic acid amide monomer represented by formula (1).

(1)

(in which $R^1$ represents any one kind selected from the group consisting of a hydrogen atom and a hydrocarbon group having 1 to 6 carbon atoms, and $R^2$ represents a hydrogen atom or a hydrocarbon group having 1 to 6 carbon atoms; $R^1$ optionally forms a ring structure together with $NR^2$).

Specific examples of the N-vinyl carboxylic acid amide include N-vinylformamide, N-vinylacetamide, N-vinylpropionamide, N-vinylbenzamide, N-vinyl-N-methylformamide, N-vinyl-N-ethylformamide, N-vinyl-N-methylacetamide, N-vinyl-N-ethylacetamide, N-vinylpyrrolidone, and the like. Among these, N-vinylacetamide is particularly preferable in terms of balance between the hydrophilicity and the hydrophobicity of the polymer. The N-vinyl carboxylic acid amide may be used as one kind singly or in combination of a plurality of kinds.

The N-vinyl carboxylic acid amide polymer is preferably a homopolymer of only a N-vinyl carboxylic acid amide. On the other hand, the N-vinyl carboxylic acid amide polymer may contain, in addition to a N-vinyl carboxylic acid amide, a monomer that is copolymerizable with the N-vinyl carboxylic acid amide (hereinafter, occasionally referred to as the "other monomer"). The other monomer is a monomer of at least one kind selected from the group consisting of an unsaturated carboxylic acid monomer, a salt of an unsaturated carboxylic acid monomer, an unsaturated carboxylic acid ester monomer, a vinyl ester monomer, and an unsaturated nitrile monomer. Among these, (meth)acrylic acid and a salt thereof are preferable, and sodium acrylate is more preferable. In the present specification, "(meth)acrylic acid" means acrylic acid and methacrylic acid.

For the N-vinyl carboxylic acid amide polymer, when the constituent units derived from N-vinyl carboxylic acid amides account for 1.00, it is preferred that the ratio of the mole number of other constituent units to the constituent units of N-vinyl carboxylic acid amide may be less than 0.250, thereby solubility in water is obtained.

In the N-vinyl carboxylic acid amide copolymer, the ratio of the mole number of the constituent units mention above is more preferably not more than 0.150, and is still more preferably is 0.

A polymerization initiator may be used when polymerizing a N-vinyl carboxylic acid amide monomer. As the polymerization initiator, those commonly used for radical polymerization of vinyl compounds may be used without limitations. Examples include redox-based polymerization initiators, azo compound-based polymerization initiators, and peroxide-based polymerization initiators.

For these, one kind may be used singly, or two or more kinds may be used in combination.

Examples of the redox-based polymerization initiator are not particularly limited as long as they are techniques in which a peroxide and a reducing agent are added, but are preferably those not containing a sulfur atom, because a sulfur atom is a cause of coloration or the like. The peroxide is a compound having a bond of oxygen atoms, and is preferably a derivative of hydrogen peroxide, such as sodium peroxide or barium peroxide. The reducing agent is preferably a reducing agent containing a divalent iron ion, an amine, a hydrogen peroxide-ferrous chloride-based reducing agent, or the like, and is more preferably one not containing a sulf atom.

Examples of the peroxide-based polymerization initiator include a persulfate of sodium, potassium, ammonium, or the like, and organic peroxides such as benzoyl peroxide, lauroyl peroxide, caproyl peroxide, t-butyl peroctoate, and diacetyl peroxide.

As the azo compound-based polymerization initiator, azo compounds such as 2,2'-azobis(2-methylbutyronitrile), 2,2'-azobis(2,4-dimethylvaleronitrile), dimethyl 2,2'-azobis (isobutyrate), dimethyl 2,2'-azobis(2-methylbutyrate), dimethyl 2,2'-azobis(2,4-dimethylpentanoate), 2,2'-azobis(2-amidinopropane) dihydrochloride, 2,2'-azobis[N-(2-carboxyethyl)-2-methylpropionamidine] n-hydrate, 2,2'-azobis[2-[N-(2-carboxyethyl)amidino]propane] n-hydrate, and dimethyl 2,2'-azobis(2-methylpropionate), and the like are given.

It is preferable to use water as a solvent; hence, a water-soluble polymerization initiator is preferable among the polymerization initiators mentioned above. Further, taking the influence of residues on the polymer into account, it is most preferable to use 2,2'-azobis[N-(carboxyethyl)-methylpropionamidine] tetrahydrate (product name: an azo compound-based polymerization initiator, VA-057, manufactured by FUJIFILM Wako Pure Chemical Corporation), which does not contain a halogen.

The polymerization initiator is preferably used dissolved in water such as ion-exchanged water.

These radical polymerization initiators may be used in combination, and polymerization may be performed by using a redox-based polymerization initiator and a water-soluble azo compound-based polymerization initiator in combination. A derivative of hydrogen peroxide and an amine are preferably used as the redox-based polymerization initiator, and 2,2'-azobis(2-amidinopropane) dihydrochloride is more preferably used as the water-soluble azo compound-based polymerization initiator.

In the case of an azo compound-based polymerization initiator, the amount of the radical polymerization initiator used is, relative to the total amount of all the monomers of 100 parts by mass, preferably not less than 0.05 parts by mass and not more than 8.0 parts by mass, more preferably not less than 0.5 parts by mass and not more than 6.0 parts by mass, and still more preferably not less than 1.0 part by mass and not more than 4.0 parts by mass. In the case of a redox-based polymerization initiator, the amount of the radical polymerization initiator used is, relative to the total amount of all the monomers of 100 parts by mass, preferably not less than 0.001 parts by mass and not more than 0.03 parts by mass, more preferably not less than 0.003 parts by mass and not more than 0.01 parts by mass, and still more preferably not less than 0.004 parts by mass and not more than 0.009 parts by mass. When the amount of the radical polymerization initiator used is within the range mentioned above, it is likely that both the rate of polymerization and the molecular weight of the copolymer will be appropriate.

When polymerizing a N-vinyl carboxylic acid amide monomer, the molecular weight may be adjusted by using a chain transfer agent. The chain transfer agent is not particularly limited as long as it can be dissolved in the monomer and the solvent mentioned above; examples include alkylthiols such as dodecyl mercaptan and heptyl mercaptan, a water-soluble thiol having a polar group, such as 3-mercaptopropionic acid (BMPA), and oil-based radical inhibitors such as an α-styrene dimer. It is also possible to use secondary alcohols such as isopropyl alcohol, phosphorous acid, hypophosphorous acid and salts thereof (sodium hypophosphite, potassium hypophosphite, and the like), and the like, carbon tetrachloride, etc.

In terms of polymerizing a N-vinyl carboxylic acid amide polymer having a low molecular weight or a low viscosity, it is preferable not to use a chain transfer agent; in the case where a chain transfer agent is used, one not containing a sulfur atom of a thiol or the like is preferable. It is presumed that a sulfur atom in a chain transfer agent affects the electron transfer of the electrically conductive polymer. In terms of reducing the sulfur concentration, it is preferable not to use sulfurous acid, sulfites, or the like having high solubility in water, which is used as a polymerization initiator or a chain transfer agent. If a sulfur atom is contained, this is a cause of coloration or the like, and may also impair dispersibility in long-term storage.

On the other hand, a chain transfer agent or a polymerization initiator containing a sulfur component can be used if the concentration of sulfur atoms is taken into consideration, as mentioned later. In this case, thiol compounds such as 2-hydroxyethanethiol, 3-mercaptopropionic acid, dodecanethiol, thioacetic acid, and 3-mercapto-1,2-propanediol are preferable.

The concentration of sulfur atoms in the N-vinyl carboxylic acid amide polymer is, relative to the total amount of all the monomers, preferably 0 or more but not more than 6000 mass ppm, more preferably 0 or more but not more than 3000 mass ppm, and still more preferably 0 or more but not more than 500 mass ppm.

An aqueous solution containing a N-vinyl carboxylic acid amide polymer has a high refractive index and is stable even under the conditions of and a redox system; therefore, even when the solution is mixed with an electrically conductive polymer, a change due to a heating change or a temporal change is less likely to occur, and consequently transparency can be kept.

In terms of not causing a viscosity increase of the electrically conductive polymer composition, the weight-average molecular weight of the N-vinyl carboxylic acid amide polymer is not less than 5000 and not more than one million, preferably not less than ten thousand and not more than five hundred thousand, more preferably not less than twenty thousand and not more than three hundred thousand, and sti more preferably not less than thirty thousand and not more than one hundred thousand.

The viscosity at 20° C. of a 5 mass % aqueous solution of the N-vinyl carboxylic acid amide polymer is not less than 10 mPa·s and not more than 5000 mPa·s, preferably not less than 20 mPa·s and not more than 2000 mPa·s, and more preferably not less than 30 mPa·s and not more than 100 mPa·s. When the viscosity is not less than 10 mPa·s, a molecular weight necessary for dispersibility can be obtained; thus, this is preferable. When the viscosity is not more than 2000 mPa·s, a viscosity increase is not caused, and therefore dispersion stability can be imparted without changing the liquidity of PEDOT-PSS; thus, this is preferable.

In the case where the N-vinyl carboxylic acid amide polymer contains water as a solvent, the pH of the electrically conductive polymer is usually within the range of 4 to 10.

In the case where the N-vinyl carboxylic acid amide contains a solvent, the solid content concentration of the N-vinyl carboxylic acid amide is preferably not less than 1 mass % and not more than 40 mass %, more preferably not less than 2 mass % and not more than 20 mass %, and still more preferably not less than 3 mass % and not more than 12 mass %. When the N-vinyl carboxylic acid amide polymer accounts for not less than 1 mass % and not more than 40 mass %, the handling of the electrically conductive polymer composition becomes easy; thus, this is preferable.

Electrically Conductive Polymer:

The electrically conductive polymer is preferably a combination of an anion doping-based electrically conductive polymer and a dopant.

The anion doping-based electrically conductive polymer is specifically preferably at least one kind selected from an aliphatic conjugated system such as polyacetylene, an aromatic conjugated system such as poly(p-phenylene), a mixed conjugated system such as poly(p-1,4-phenylenevinylene), a heterocyclic conjugated system such as polypyrrole or polythiophene, a heteroatom-containing conjugated system such as polyaniline, a multiple-chain conjugated system such as polyacene (a virtual molecule), and the like. Among these, poly(3,4-ethylenedioxythiophene) (hereinafter, also referred to as PEDOT) is particularly preferable.

The dopant needs only to have the action of giving and receiving an electron; however, preferably, in terms of maintaining the electrical conductance of a coating film, the dopant is suitably a dopant having a sulfonic acid group, and is preferably at least one selected from polystyrenesulfonic acid, p-toluenesulfonic acid, dodecylbenzenesulfonic acid, 1,5-anthraquinonedisulfonic acid, 2,6-anthraquinonedisulfonic acid, anthraquinonesulfonic acid, 4-hydroxybenzenesulfonic acid, methylsulfonic acid, nitrobenzenesulfonic acid, and the like. Among these, poly(4-styrenesulfonic acid) (hereinafter, also referred to as PSS) is particularly preferable.

Among these, a combination of poly(3,4-ethylenedioxythiophene) doped with poly(4-styrenesulfonic acid) (hereinafter, also referred to as PEDOT-PSS) is most preferable.

For the relationship between the electrically conductive polymer and the N-vinyl carboxylic acid amide polymer, when the solid content of the conductive polymer is 100 parts by mass, the solid content of the N-vinyl carboxylic acid amide polymer is within the range of preferably not less than 10 parts by mass and not more than 200 parts by mass, more preferably not less than 20 parts by mass and not more than 140 parts by mass, and still more preferably not less than 30 parts by mass and not more than 70 parts by mass.

When the N-vinyl carboxylic acid amide polymer is contained at such a ratio, the temporal change of the electrically conductive polymer can be suppressed sufficiently; thus, this is preferable.

Solvent:

The solvent used for the electrically conductive polymer composition of the present invention is preferably a polar solvent such as water or an alcohol, and particularly preferably water. Among these, water is particularly preferable in terms of the dispersibility of the electrically conductive polymer and the N-vinyl carboxylic acid amide polymer.

Constitution:

For the constitution of the electrically conductive polymer composition, when the total composition is 100%, the solid content composed of the N-vinyl carboxylic acid amide polymer and the electrically conductive polymer is within the range of preferably 0.1 to 30.0 mass %, more preferably 0.5 to 20.0 mass %, and still more preferably 1.0 to 5.0 mass %.

Further, the N-vinyl carboxylic acid amide polymer in the solid content falls within the range of, preferably 10 to 80 mass %, more preferably 20 to 60 mass %, and still more preferably 30 to 40 mass %.

The solid content concentration of the N-vinyl carboxylic acid amide polymer in the electrically conductive polymer composition is preferably not less than 0.3 mass % and not more than 10 mass %, more preferably not less than 0.5 mass % and not more than 5 mass %, and still more preferably not less than 0.7 mass % and not more than 3 mass %.

When the N-vinyl carboxylic acid amide polymer is contained at such a ratio, the temporal change of the electrically conductive polymer can be suppressed sufficiently, and the viscosity of the electrically conductive polymer composition is not increased; thus, this is preferable.

The N-vinyl carboxylic acid amide polymer by itself has the effect of dispersing and stabilizing the electrically conductive polymer; in this case, it is used in the form of a solution, having been dissolved in a solvent, or a dispersion.

The viscosity of the electrically conductive polymer composition is preferably not less than 10 mPa·s and not n than 400 mPa·s, more preferably not less than 20 mPa·s and not more than 300 mPa·s, and still more preferably not less than 30 mPa·s and not more than 200 mPa·s. When the viscosity is not less than 10 mPa·s, a polymer having a molecular weight necessary for dispersibility is contained. When the viscosity is not more than 400 mPa·s, a viscosity increase is not caused, and therefore dispersion stability can be imparted without changing the liquidity of PEDOT-PSS; thus, this is preferable.

The electrically conductive polymer added is not particularly limited, and may be any of those mentioned above as examples, and is preferably PEDOT and PSS.

According to the present invention, a method for stably storing an electrically conductive polymer solution is also provided by adding the N-vinyl carboxylic acid amide polymer mentioned above or an electrically conductive polymer dispersion stabilizer containing this N-vinyl carboxylic acid amide polymer, to an electrically conductive polymer solution.

EXAMPLES

Hereinbelow, the present invention is described by using Examples; but the present invention is not construed as being limited to these at all.

Solid Content Concentration:

The solid content concentration was calculated in the following manner.

Approximately 3.0 g of a sample (a N-vinyl carboxylic acid amide polymer or an electrically conductive polymer composition) was collected, was put on an aluminum cup, was spread with a spoon flatly and uniformly on the bottom of the aluminum cup, and was heated at 140° C. and dried for 90 minutes with a thermobalance (PM460, manufactured by Mettler Toledo K. K.); the mass after cooling was measured, and the solid content concentration was measured by the following formula.

Solid content concentration(mass %)=100×($M3-M1$)÷($M2-M1$)

M1: The mass of the aluminum cup (g)
M2: The mass of the specimen before drying+the mass of the aluminum cup (g)
M3: The mass of the specimen after drying+the mass of the aluminum cup (g)

Viscosity:

In the case where the viscosity of a N-vinyl carboxylic acid amide polymer aqueous solution is measured, a N-vinyl carboxylic acid amide polymer is put into a 300-ml tall beaker, and is diluted with ion-exchanged water in such a manner that the solid content concentration is 5 mass %. In the case where the viscosity of an electrically conductive polymer composition is measured, the measurement is performed without dilution. The measurement object is allowed to stand still in a 20° C. constant temperature bath for 12 hours or more, and a state where there are completely no internal air bubbles is created. After that, the beaker is put into a constant temperature water bath adjusted to a temperature of 20° C., and a thermometer is used to check that the temperature of the test object is 20±0.5° C.; the viscosity is measured under the following conditions by using a Brookfield viscometer shown in JIS K-7117-1-1999. The viscosity 10 minutes after the installation of the viscometer is recorded.

Viscometer: a DVE (Brookfield) viscometer, the HA type
Spindle: a No. 6 spindle
Rotation rate: 50 rpm
Temperature: 20° C.

Particle Size:

A laser diffraction/scattering particle size distribution measuring apparatus (Partica mini LA-350, manufactured by Horiba, Ltd.) was used to measure the median size on a volume distribution basis (hereinafter, also referred to as $d_{50}$) and the volume average size on a volume distribution basis.

Measurement of the Absolute Molecular Weights of Standard N-Vinylacetamide Polymers for Preparing a GPC Calibration Curve:

A N-vinylacetamide homopolymer of each of various molecular weight regions was dissolved in an eluent, and the solution was allowed to stand still for 20 hours. The solid content concentration in this solution is 0.05 mass %.

The solution was filtered with a 0.45-μm membrane filter, and the filtrate was subjected to GPC-MALS (a multiangle light scattering detector) to measure the absolute molecular weight of the peak position.

GPC: Shodex (registered trademark) SYSTEM 21, manufactured by Showa Denko K. K.
Column: Shodex (registered trademark) LB-80, manufactured by Showa Denko K. K.
Column temperature: 40° C.
Eluent: 0.1 mol/L $NaH_2PO_4$+0.1 mol/L $Na_2HPO_4$
Flow velocity: 0.64 mL/min
Amount of the specimen injected: 100 μL
MALS detector: DAWN (registered trademark) DSP, manufactured by Wyatt Technology Corporation
Laser wavelength: 633 nm
Multiangle fitting method: The Berry method Weight-Average Molecular Weight:

A N-vinylacetamide polymer was diluted with distilled water in such a manner that the solid content concentration was 0.1 mass-, and the weight-average molecular weight Mw was measured by the GPC (gel permeation chromatography) method under the following conditions.

The weight-average molecular weight in the present measurement was obtained by using a calibration curve prepared from the results of measurement of the absolute molecular weights of N-vinylacetamide polymers of various molecular weight regions using a multiangle light scattering detector.

Detector (RI): SHODEX (registered trademark) RI-201H, manufactured by Showa Denko K. K.
Pump: LC-20AD, manufactured by Shimadzu Corporation
Column oven: SHODEX (registered trademark) AO-30C, manufactured by Showa Denko K. K.
Analysis apparatus: SIC 480II Data Station, manufactured by System Instruments Co., Ltd.
Column: SHODEX (registered trademark) SB806 (2 columns), manufactured by Showa Denko K. K.
Eluent: Distilled water/2-propanol=8/2 (mass ratio)
Flow rate: 0.7 ml/min Suction Filtration Test:

10 ml of an electrically conductive polymer composition was subjected to vacuum filtration using a membrane filter with a pore size of 0.45 μm and a funnel, and the number of aggregates obtained on the filter paper was measured by visual inspection.

Discoloration:

The change in color before and after a preservation stability test of the electrically conductive polymer composition was investigated by visual inspection.

Manufacturing Example 1

250 g of ion-exchanged water that was adjusted to pH=7.0 with triethanolamine was introduced into a five-neck 1-L separable flask equipped with a nitrogen gas introduction tube, a stirring machine, two solvent dropping apparatuses, and a thermometer. Stirring of the solution was performed while replacement with nitrogen gas was performed, and stirring was performed at 99° C. for 120 minutes. 107 g of vinylacetamide (manufactured by Showa Denko K.K.) and 140 g of ion-exchanged water that was adjusted to pH=7.0 with triethanolamine were put into a solvent dropping apparatus, and were dissolved. In another solvent dropping apparatus, 3.2 g of 2,2'-azobis[N-(carboxyethyl)-2-methyl-propionamidine]tetrahydrate (hereinafter, VA-057) (manufactured by FUJIFILM Wako Pure Chemical Corporation) serving as a polymerization initiator was dispersed in 40 g of ion-exchanged water that was adjusted to pH=7.0 with triethanolamine. The separable flask was maintained at 99° C., and the solution and the dispersion mentioned above were dropped onto the separable flask from the two respective solvent dropping apparatuses by using pumps, each for 2 hours. After the dropping was ended, this was kept for 15 minutes; then, 0.5 g of VA-057 was dispersed in 35 g of ion-exchanged water that was adjusted to pH=7.0 with triethanolamine, and the dispersion was dropped from the solvent dropping apparatus for 5 minutes. The polymerization initiator accounts for 3.4 mass % relative to the monomer. 45 minutes later, 488 g of ion-exchanged water that was adjusted to pH=7.0 with triethanolamine was added, and cooling was performed; this was kept at 50° C. for 1 hour, and then sampling was performed; it was checked that the concentration of the remaining N-vinylacetamide monomer was 1,000 mass ppm or less, and it was thus determined that t reaction was ended. The weight-average molecular weight of the N-vinyl carboxylic acid amide polymer was 80,000, and the viscosity of an aqueous solution with a solid content concentration of 5 mass % was 80 mPa·S.

Manufacturing Example 2

Manufacturing was performed similarly to Manufacturing Example 1 except that 1.6 g of 3-mercapto-1,2-propanediol (manufactured by Asahikagaku Kogyo Co., Ltd.), which is a chain transfer agent, was added when putting in 107 g of N-vinylacetamide (manufactured by Showa Denko K.K.) and 140 g of ion-exchanged water that was adjusted to pH=7.0 with triethanolamine. The weight-average molecular weight of the N-vinyl carboxylic acid amide polymer was 59,000, and the viscosity of an aqueous solution with a solid content concentration of 5 mass % was 78 mPa-S. The sulfur concentration in the solid content of the N-vinyl carboxylic acid amide polymer was 4500 mass ppm.

Example 1

In a 50-ml beaker, 2.0 g of the N-vinylacetamide polymer aqueous solution manufactured in Manufacturing Example 1 was added to 20 g of a solution in which a 4.0 mass % PEDOT-PSS dispersion was diluted twice in terms of mass with ion-exchanged water, and stirring was performed for 5 minutes with a magnetic stirrer (400 rpm); thus, an electrically conductive polymer composition was obtained.

Example 2

A procedure was performed similarly to Example 1 except that the sulfur-containing N-vinylacetamide polymer manufactured in Manufacturing Example 2 was used as the N-vinylacetamide polymer.

Comparative Example 1

A procedure was performed similarly to Example 1 except that 2.0 g of water was added in place of the N-vinylacetamide polymer aqueous solution. The viscosity of the water was 20.1 mPa-S.

Comparative Example 2

A procedure was performed similarly to Example 1 except that a solution in which 11 g of a N-vinylpyrrolidone polymer (the weight-average molecular weight: 40000, the viscosity of an aqueous solution with a solid content concentration of 5 mass %: 56.6 mPa·S) was dissolved in 99 g of ion-exchanged water was used in place of the N-vinylacetamide polymer aqueous solution.

Comparative Example 3

A procedure was performed similarly to Example 1 except that a solution in which 11 g of a N-vinylacetamide polymer (GE191-000, manufactured by Showa Denko K. K.) in a powder form was dissolved in 99 g of ion-exchanged water was used as the N-vinylacetamide polymer.

Example 3

In a 50-ml beaker, 2.0 g of the N-vinylacetamide polymer aqueous solution manufactured in Manufacturing Example 1 was added to 25 g of a solution in which a 4.0 mass % PEDOT-PSS dispersion was diluted twice in terms of mass with ion-exchanged water, and stirring was performed for 5 minutes with a magnetic stirrer (400 rpm); thus, an electrically conductive polymer composition was obtained.

Example 4

In a 50-ml beaker, 1.0 g of the N-vinylacetamide polymer aqueous solution manufactured in Manufacturing Example 1 was added to 25 g of a solution in which a 4.0 mass % PEDOT-PSS dispersion was diluted twice in terms of mass with ion-exchanged water, and stirring was performed for 5 minutes with a magnetic stirrer (400 rpm); thus, an electrically conductive polymer composition was obtained.

Comparative Example 4

A procedure was performed similarly to Example 3 except that 1.0 g of water was added in place of the N-vinylacetamide polymer aqueous solution.

Example 5

In a 50-ml beaker, 25 g of a 4.0 mass % PEDOT-PSS dispersion and 1.0 g of the N-vinylacetamide polymer aqueous solution manufactured in Manufacturing Example 1 were added, and stirring was performed for 5 minutes with a magnetic stirrer (400 rpm); thus, an electrically conductive polymer composition was obtained.

Comparative Example 5

A procedure was performed similarly to Example 5 except that 1.0 g of water was added in place of the N-vinylacetamide polymer aqueous solution.

The reagents used are as follows.

PEDOT-PSS: A 3.0-4.0% aqueous solution, a high electrical conductivity grade, manufactured by Sigma-Aldrich Japan G. K.

N-Vinylpyrrolidone polymer: K 30 (weight-average molecular weight: 40000), manufactured by Tokyo Chemical Industry Co., Ltd.

N-Vinylacetamide polymer (powder): GE191-000, manufactured by Showa Denko K.K.

Preservation Stability Evaluation:

Preservation stability was evaluated for Examples 1 and 2 and Comparative Examples 1 and 2. In Comparative Example 3, the viscosity of the N-vinylacetamide was high and inappropriate, and evaluation was not performed.

10 g of the prepared electrically conductive polymer composition was put into each of 20-ml lid-equipped glass test tubes and the tubes were sealed, and state samples treated under the following treatment conditions were prepared.

i) Freezing: −15° C.×6 Hr

An environment of −15° C. was kept for 6 hours into a frozen state by using a freezing machine (KD-3142, Nihon Freezer Co., Ltd.), and then the sample temperature changed to 30° C., taking 2 hours.

ii) Heating: 80° C.×48 Hr

For another sample, an environment of 80° C. was kept for 48 hours in an autoclave (DN-41, Yamato Scientific Co., Ltd.), and then the sample temperature changed to 30° C., taking 2 hours.

iii) Heating: 97° C.×72 Hr

For still another sample, an environment of 97° C. was kept for 72 hours in an autoclave (DN-41, Yamato Scientific Co., Ltd.), and then the sample temperature changed to 30° C., taking 2 hours.

The heating and freezing were performed as an accelerated test.

Each sample was subjected to particle size measurement, a suction filtration test, and the observation of discoloration by visual inspection.

A sample in which the number of aggregates was 0 was classified as A, a sample in which it was 1 to 3 was as B, and a sample in which it was 4 or more was as C; a sample in which there was no discoloration was classified as A, a sample in which there was a little discoloration was as B, and a sample in which there was significant discoloration was as C; as an overall assessment, a sample in which both the above items were A was assessed as A, a sample in which they were A and B, or B and B, was assessed as B, and the others were assessed as C.

For Examples 3 to 5 and Comparative Examples 4 and 5, a preservation stability test for a longer period than that in Examples 1 and 2 and Comparative Examples 1 and 2 was performed, and evaluation was performed by viscosity change and particle size measurement.

In Examples 3 to 5 and Comparative Examples 4 and 5, 10 g of the prepared electrically conductive polymer composition was put into each of 20-ml lid-equipped glass test tubes and the tubes were sealed, and state samples treated under the following treatment conditions were prepared. The temperatures described in Table 2 and Table 3 were kept for the periods described in Tables 2 and 3 by using an autoclave (DN-41, Yamato Scientific Co., Ltd.), and then the sample temperature changed to 30° C., taking 2 hours.

The results are shown in Tables 1 to 3.

TABLE 1

| Sample | N-carboxylic acid amide polymer *1 | | | Constitution of electrically conductive polymer composition | | | Before degradation test | |
|---|---|---|---|---|---|---|---|---|
| | Weight-average molecular weight Mw | Sulfur element concentration in solid content mass ppm | Viscosity mPa · s | Solid content of N-carboxylic acid amide polymer mass % | Solid content of PEDOT-PSS mass % | Viscosity mPa · s | Particle size $d_{50}$ μm | Number of aggregates Number of pieces on filter (aggregates) |
| Example 1 | 80 thousand | 0 | 80 | 0.9 | 1.8 | 72 | Less than 0.1 | 0 |
| | | | | | | | Less than 0.1 | 0 |
| | | | | | | | Less than 0.1 | 0 |
| Example 2 | 59 thousand | 4500 | 78 | 0.9 | 1.8 | 71 | Less than 0.1 | 0 |
| Comparative Example 1 | | Not used | | 0 | 1.8 | 72 | Less than 0.1 | 0 |
| | | | | | | | Less than 0.1 | 0 |
| | | | | | | | Less than 0.1 | 0 |
| Comparative Example 2 | 40 thousand (PVP) | 0 | 56.6 | 0.9 (PVP) | 1.8 | 50 | Less than 0.1 | 0 |
| | | | | | | | Less than 0.1 | 0 |
| | | | | | | | Less than 0.1 | 0 |
| Comparative Example 3 | 5 million | 147 | 500 | — | — | — | — | — |

| Sample | | Treatment conditions | After degradation test | | Discoloration (visual inspection) | Overall assessment *2 |
|---|---|---|---|---|---|---|
| | | | Particle size $d_{50}$ μm | Number of aggregates Number of pieces on filter (aggregates) | | |
| Example 1 | | Freezing −15° C. × 6 Hr | 0.1 | 0 | No discoloration | A |
| | | Heating 80° C. × 48 Hr | 1.5 | 1 | No discoloration | B |
| | | Heating 97° C. × 72 Hr | Less than 0.1 | 2 | No discoloration | B |
| Example 2 | | Heating 97° C. × 72 Hr | Less than 0.1 | 2 | Changed to blue | C |
| Comparative Example 1 | | Freezing −15° C. × 6 Hr | 56.8 | More than 100 (counting was difficult) | No discoloration | C |
| | | Heating 80° C. × 48 Hr | 2.5 | 22 | No discoloration | C |
| | | Heating 97° C. × 72 Hr | Less than 0.1 | 35 | No discoloration | A |
| Comparative Example 2 | | Freezing −15° C. × 6 Hr | 2.1 | 6 | No discoloration | C |
| | | Heating 80° C. × 48 Hr | 1.8 | 4 | Changed to blue | C |
| | | Heating 97° C. × 72 Hr | Less than 0.1 | 8 | Changed to blue | C |
| Comparative Example 3 | | — | — | — | — | — |

*1 In Comparative Example 2, the characteristics of the n-vinylpyrrolidone polymer (PVP) and the amount of the solid content thereof are shown.
*2 Assessments: When the number of aggregates is 0, assessed as "A"; when 1 to 3, as "B"; and when 4 or more, as "C"
There is no discoloration: A;
There is discoloration: C
When both of the two items are A or more: assessed as A;
when they are AB and BB: assessed as B; and
for all other cases: assessed as C FIG. 1 and FIG. 2 show particle size distributions of the electrically conductive polymer compositions after the freezing and heating tests of Example 1 and Comparative Example 1, respectively.

In Example 1, there is no discoloration, the number of aggregates is small, and the particle size is small; thus, the composition is usable.

In Example 2, the color has changed to blue, and it is suggested that the dispersion state of the electrically conductive polymer has changed because of the presence of a sulfur compound derived from the chain transfer agent; however, the particle size is small and the number of aggregates is small, and the composition is usable.

Figure 1:
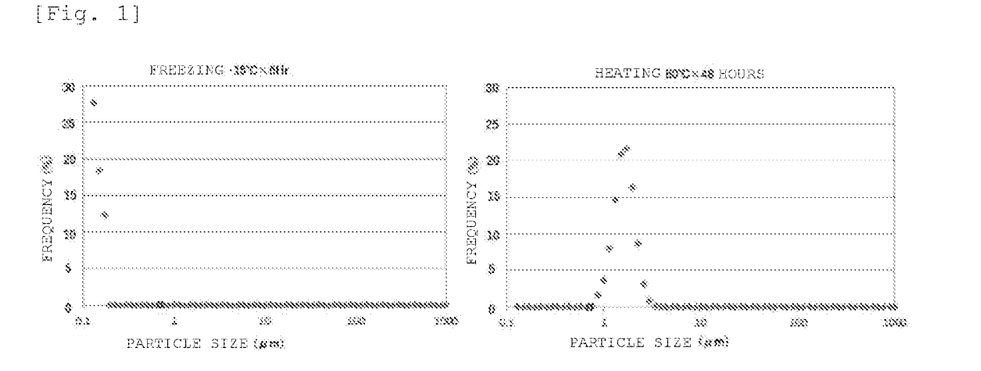
FIG. 1 shows particle size distributions of an electrically conductive polymer composition after the freezing and heating tests, which were evaluated in Example 1.
Figure 2:
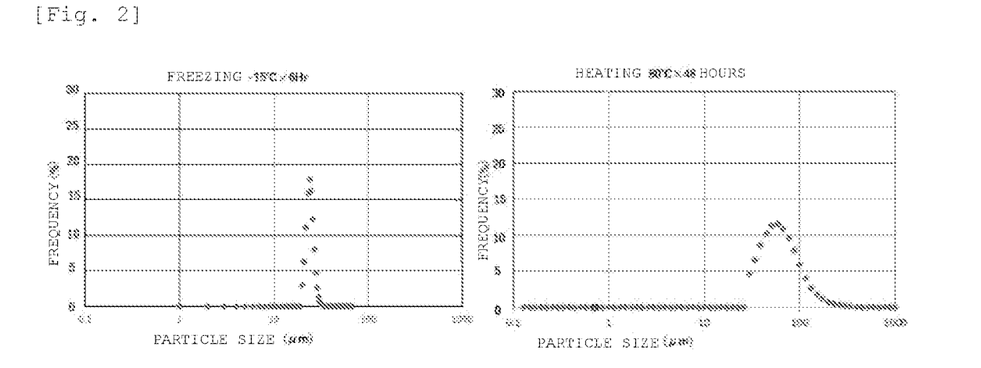
FIG. 2 shows particle size distributions of an electrically conductive polymer composition after the freezing and heating tests, which were evaluated in Comparative Example 1.

From Table 1, and FIG. 1 and FIG. 2, it has been found that, in Comparative Example 1 and Comparative Example 2, in which PNVA is not added, the particle size is larger than in Example 1 and aggregation has progressed.

It can also be seen that, in an aggregation test, Comparative Example 1 and Comparative Example 2 have larger numbers of aggregates than Example 1.

In Comparative Example 2, the color has changed to blue, and it is suggested that also the aggregation state has changed. It is suggested that the N-vinylpyrrolidone polymer has changed because of the acidic state of the electrically conductive polymer.

In Comparative Example 3, an electrically conductive polymer composition in which a N-vinyl carboxylic acid amide polymer accounted for 1 mass % was prepared under conditions similar to those of Patent Literature 3; the viscosity was as high as 500 mPa·s, and there was difficulty in handling this as an electrically conductive polymer composition in transportation or the like.

TABLE 2

| Sample | Solid content of N-vinyl carboxylic acid amide polymer quantity % | Temperature of degradation test ° C. | Viscosity mPa·s | | | | | Particle size as of 4 weeks later | |
|---|---|---|---|---|---|---|---|---|---|
| | | | At time of start of degradation test | 1 week after start of degradation test | 2 weeks after start of degradation test | 3 weeks after start of degradation test | 4 weeks after start of degradation test | Median size μm | Arithmetic average μm |
| Example 3 | 0.7 | 40 | 126 | 141 | 139 | 139 | 139 | 1 | 1 |
| Example 4 | 0.4 | | 71 | 56 | 54 | 53 | 51 | 2 | 2 |
| Comparative Example 4 | 0 | | 56 | 54 | 51 | 49 | 49 | 184 | 251 |
| Example 3 | 0.7 | 30 | 129 | 144 | 146 | 146 | 146 | 1 | 1 |
| Example 4 | 0.4 | | 73 | 58 | 56 | 56 | 56 | 2 | 2 |
| Comparative Example 4 | 0 | | 58 | 56 | 51 | 51 | 51 | 191 | 217 |
| Example 4 | 0.4 | 10 | 71 | 68 | 68 | 64 | 64 | 2 | 2 |
| Comparative Example 4 | 0 | | 58 | 56 | 58 | 58 | 56 | 710 | 591 |

It has been found that, in Comparative Example 4, in which PNVA is not added, the particle size is larger than in Examples 3 and 4 and aggregation has progressed.

TABLE 3

| Sample | Solid content of N-vinyl carboxylic acid amide polymer quantity % | Temperature of degradation test ° C. | Viscosity mPa·s | | | | | | | | Particle size as of 4 weeks later | |
|---|---|---|---|---|---|---|---|---|---|---|---|---|
| | | | At time of start of degradation test | 1 day after start of degradation test | 2 days after start of degradation test | 5 days after start of degradation test | 7 days after start of degradation test | 2 weeks after start of degradation test | 3 weeks after start of degradation test | 4 weeks after start of degradation test | Median size μm | Arithmetic average μm |
| Example 5 | 0.4 | 10 | 426 | 336 | 341 | 354 | 361 | 390 | 401 | 429 | 4 | 4 |
| Comparative Example 5 | 0 | | 321 | 317 | 321 | 332 | 341 | 362 | 379 | 403 | 710 | 591 |

In both of Example 5 and Comparative Example 5, in which the PEDOT-PSS concentration is higher than in the other Examples and Comparative Examples, an increase in viscosity due to the degradation test was observed. It is surmised that this is due to the interaction between molecules of PEDOT-PSS.

However, it has been found that, in Comparative Example 5, in which PNVA is not added, the particle size is larger than in Example 5 and aggregation has progressed.

The invention claimed is:

1. An electrically conductive polymer composition comprising at least:
   a N-vinylacetamide polymer having a weight-average molecular weight within a range of not less than 5000 and not more than one million;
   an electrically conductive polymer; and
   a solvent,
   wherein a viscosity at 20° ° C. of the electrically conductive polymer composition is not less than 10 mPa·s and not more than 400 mPa·s.

2. The electrically conductive polymer composition according to claim 1, wherein,
   when the solid content of the conductive polymer is 100 parts by mass, the solid content of the N-vinylacetamide polymer is not less than 10 parts by mass and not more than 200 parts by mass.

3. The electrically conductive polymer composition according to claim 1, wherein
   a solid content concentration of the N-vinylacetamide polymer in the electrically conductive polymer composition is not less than 0.3 mass % and not more than 10 mass %.

4. The electrically conductive polymer composition according to claim 1, wherein
   the electrically conductive polymer is poly(3,4-ethylenedioxythiophene) doped with poly(4-styrenesulfonic acid) (hereinafter, referred to as PEDOT-PSS).

5. The electrically conductive polymer composition according to claim 1, wherein
   the solvent is water.

6. The electrically conductive polymer composition according to claim 1, wherein
   a sulfur concentration in a solid content of the N-vinylacetamide polymer is not more than 3000 mass ppm.

7. The electrically conductive polymer composition according to claim 1, wherein
   the N-vinylacetamide polymer is a polymer manufactured by polymerizing N-vinylacetamide in the presence of a chain transfer agent not containing a sulfur atom, or polymerizing a N-vinylacetamide without the use of a chain transfer agent.

8. The electrically conductive polymer composition according to claim 1, wherein
   the N-vinylacetamide polymer has a weight-average molecular weight within a range of not less than 5000 and not more than 59,000.

9. The electrically conductive polymer composition according to claim 1, wherein
the N-vinylacetamide polymer has a weight-average molecular weight within a range of not less than 59,000 and not more than one million.

10. A method for stably storing an electrically conductive polymer solution, the method comprising:
adding, to an electrically conductive polymer solution, a N-vinylacetamide polymer having a weight-average molecular weight within a range of not less than 5000 and not more than one million,
wherein a sulfur concentration in a solid content of the N-vinylacetamide polymer is not more than 3000 mass ppm.

11. The method for stably storing an electrically conductive polymer solution according to claim 10, wherein
the electrically conductive polymer solution contains at least PEDOT-PSS and water.

12. The method for stably storing an electrically conductive polymer solution according to claim 10, wherein
the N-vinylacetamide polymer is a polymer manufactured by polymerizing N-vinylacetamide in the presence of a chain transfer agent not containing a sulfur atom, or polymerizing N-vinylacetamide without the use of a chain transfer agent.

13. The method for stably storing an electrically conductive polymer solution according to claim 10, wherein
the N-vinylacetamide polymer has a weight-average molecular weight within a range of not less than 5000 and not more than 59,000.

14. The method for stably storing an electrically conductive polymer solution according to claim 10, wherein
a sulfur concentration in a solid content of the N-vinylacetamide polymer is not more than 500 mass ppm.

15. The method for stably storing an electrically conductive polymer solution according to claim 10, wherein
the N-vinylacetamide polymer has a weight-average molecular weight within a range of not less than 59,000 and not more than one million.

* * * * *